(12) United States Patent
Shum

(10) Patent No.: US 8,269,245 B1
(45) Date of Patent: Sep. 18, 2012

(54) OPTICAL DEVICE WITH WAVELENGTH SELECTIVE REFLECTOR

(75) Inventor: Frank Tin Chung Shum, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

(21) Appl. No.: 12/914,789

(22) Filed: Oct. 28, 2010

Related U.S. Application Data

(60) Provisional application No. 61/257,298, filed on Nov. 2, 2009, provisional application No. 61/257,303, filed on Nov. 2, 2009, provisional application No. 61/256,934, filed on Oct. 30, 2009.

(51) Int. Cl.
*H01L 33/00* (2010.01)

(52) U.S. Cl. ........................................ 257/98

(58) Field of Classification Search ............... 257/98
See application file for complete search history.

(56) References Cited

U.S. PATENT DOCUMENTS

| | | | |
|---|---|---|---|
| 6,853,010 B2 * | 2/2005 | Slater et al. | 257/98 |
| 7,053,413 B2 | 5/2006 | D'Evelyn et al. | |
| 7,113,658 B2 * | 9/2006 | Ide et al. | 385/11 |
| 7,148,515 B1 | 12/2006 | Huang et al. | |
| 7,220,324 B2 | 5/2007 | Baker et al. | |
| 7,252,408 B2 | 8/2007 | Mazzochette | |
| 7,253,446 B2 * | 8/2007 | Sakuma et al. | 257/98 |
| 7,338,828 B2 | 3/2008 | Imer et al. | |
| 7,550,305 B2 | 6/2009 | Yamagata et al. | |
| 2005/0084218 A1 * | 4/2005 | Ide et al. | 385/88 |
| 2006/0065900 A1 | 3/2006 | Hsieh et al. | |
| 2006/0152795 A1 | 7/2006 | Yang | |
| 2006/0208262 A1 * | 9/2006 | Sakuma et al. | 257/79 |
| 2006/0240585 A1 | 10/2006 | Epler et al. | |
| 2006/0262545 A1 | 11/2006 | Piepgras et al. | |
| 2009/0173958 A1 * | 7/2009 | Chakraborty et al. | 257/98 |
| 2009/0315965 A1 | 12/2009 | Yamagata et al. | |
| 2010/0003492 A1 | 1/2010 | D'Evelyn | |
| 2010/0025656 A1 * | 2/2010 | Raring et al. | 257/13 |
| 2010/0060130 A1 | 3/2010 | Li et al. | |
| 2011/0140150 A1 | 6/2011 | Shum | |
| 2011/0182056 A1 | 7/2011 | Trottier et al. | |
| 2011/0182065 A1 | 7/2011 | Negley et al. | |
| 2011/0186874 A1 | 8/2011 | Shum | |
| 2011/0186887 A1 | 8/2011 | Trottier et al. | |
| 2011/0198979 A1 | 8/2011 | Shum et al. | |
| 2011/0204763 A1 | 8/2011 | Shum et al. | |
| 2011/0204779 A1 | 8/2011 | Shum et al. | |
| 2011/0204780 A1 | 8/2011 | Shum et al. | |
| 2011/0215348 A1 | 9/2011 | Trottier et al. | |

OTHER PUBLICATIONS

U.S. Appl. No. 13/135,087, filed Jun. 23, 2011, Trottier et al.
U.S. Appl. No. 12/914,789, filed Oct. 28, 2010, Shum.
U.S. Appl. No. 12/858,379, filed Aug. 17, 2010, Shum.
U.S. Appl. No. 61/257,303, filed Nov. 2, 2009, Shum.
U.S. Appl. No. 61/256,934, filed Oct. 30, 2009, Shum.
U.S. Appl. No. 61/241,457, filed Sep. 11, 2009, Shum.
U.S. Appl. No. 61/241,455, filed Sep. 11, 2009, Shum.

\* cited by examiner

*Primary Examiner* — Alexander G. Ghyka
*Assistant Examiner* — Stanetta Isaac
(74) *Attorney, Agent, or Firm* — Kilpatrick Townsend & Stockton LLP

(57) ABSTRACT

Techniques are disclosed for transmitting electromagnetic radiation from LED devices, such as ultra-violet, violet, blue, blue and yellow, or blue and green, fabricated on bulk semi-polar or nonpolar materials with phosphors. The starting material include polar gallium nitride.

19 Claims, 12 Drawing Sheets

OPTICAL DEVICE WITH WAVELENGTH SELECTIVE REFLECTOR

CROSS-REFERENCE TO RELATED APPLICATIONS

This application claims priority to U.S. Provisional Patent Application No. 61/257,298, filed Nov. 2, 2009; U.S. Provisional Patent Application No. 61/257,303, filed Nov. 2, 2009; and U.S. Provisional Patent Application No. 61/256,934, filed Oct. 30, 2009, each of which is commonly owned, and hereby incorporated by reference for all purposes.

BACKGROUND OF THE INVENTION

This invention relates generally to lighting techniques, and more particularly to techniques for transmitting electromagnetic radiation from LED devices, such as ultra-violet, violet, blue, blue and yellow, or blue and green, fabricated on bulk semipolar or nonpolar materials with use of entities such as phosphors, which emit light in a reflection mode. In other embodiments, the starting materials can include polar gallium nitride containing materials, and others. Merely by way of example, the invention can be applied to applications such as white lighting, multi-colored lighting, general illumination, decorative lighting, automotive and aircraft lamps, street lights, lighting for plant growth, indicator lights, lighting for flat panel displays, other optoelectronic devices, and the like.

In the late 1800's, Thomas Edison invented the light bulb. The conventional light bulb, commonly called the "Edison bulb," has been used for over one hundred years. The conventional light bulb uses a tungsten filament enclosed in a glass bulb sealed in a base, which is screwed into a socket. The socket is coupled to an AC or DC power source. The conventional light bulb can be found commonly in houses, buildings, and outdoor lightings, and other areas requiring light. Unfortunately, the conventional light bulb dissipates more than 90% of the energy used as thermal energy. Additionally, the conventional light bulb routinely fails often due to thermal expansion and contraction of the filament element.

Fluorescent lighting overcomes some of the drawbacks of the conventional light bulb. Fluorescent lighting uses an optically clear tube structure filled with a halogen gas and mercury. A pair of electrodes in the halogen gas is coupled to an alternating power source through ballast. Once the gas has been excited, it discharges to emit light. Typically, the optically clear tube is coated with phosphors, which are excited by the light. Many building structures use fluorescent lighting and, more recently, fluorescent lighting has been fitted onto a base structure, which couples into a standard socket.

Solid state lighting techniques have also been used. Solid state lighting relies upon semiconductor materials to produce light emitting diodes, commonly called LEDs. At first, red LEDs were demonstrated and introduced into commerce. Red LEDs use Aluminum Indium Gallium Phosphide or AlInGaP semiconductor materials. Most recently, Shuji Nakamura pioneered the use of InGaN materials to produce LEDs emitting light in the blue color range for blue LEDs. The blue colored LEDs led to innovations such as solid state white lighting, the blue laser diode, which in turn enabled the Blu-Ray™ (trademark of the Blu-Ray Disc Association) DVD player, and other developments. Other colored LEDs have also been proposed.

High intensity UV, blue, and green LEDs based on GaN have been proposed and even demonstrated with some success. Efficiencies have typically been highest in the UV-violet, dropping off as the emission wavelength increases to blue or green. Unfortunately, achieving high intensity, high-efficiency GaN-based green LEDs has been particularly problematic. The performance of optoelectronic devices fabricated on conventional c-plane GaN suffer from strong internal polarization fields, which spatially separate the electron and hole wave functions and lead to poor radiative recombination efficiency. Since this phenomenon becomes more pronounced in InGaN layers with increased indium content for increased wavelength emission, extending the performance of UV or blue GaN-based LEDs to the blue-green or green regime has been difficult. Furthermore, since increased indium content films often require reduced growth temperature, the crystal quality of the InGaN films is degraded. The difficulty of achieving a high intensity green LED has lead scientists and engineers to the term "green gap" to describe the unavailability of such green LED. In addition, the light emission efficiency of typical GaN-based LEDs drops off significantly at higher current densities, as are required for general illumination applications, a phenomenon known as "roll-over." Other limitations with blue LEDs using c-plane GaN exist. These limitations include poor yields, low efficiencies, and reliability issues. Although successful, solid state lighting techniques must be improved for full exploitation of their potential.

From the above, it is seen that techniques for improving optical devices is highly desired.

BRIEF SUMMARY OF THE INVENTION

The present invention relates generally to lighting techniques and more particularly to techniques for transmitting electromagnetic radiation from LED devices, such as ultra-violet, violet, blue, blue and yellow, or blue and green, fabricated on bulk semipolar or nonpolar materials with use of entities such as phosphors, which emit light in a reflection mode. In other embodiments, the starting materials can include polar gallium nitride containing materials, and others. Merely by way of example, the invention can be applied to applications such as white lighting, multi-colored lighting, general illumination, decorative lighting, automotive and aircraft lamps, street lights, lighting for plant growth, indicator lights, lighting for flat panel displays, other optoelectronic devices, and the like.

According to an embodiment, the present invention provides an optical device. The device includes a substrate member having a surface region. The device also includes at least one LED configured overlying one or more portions of the surface region. The device further includes a spacer member having two or more sidewalls, the sidewall being characterized by an angle. The device additionally includes a wavelength conversion material disposed overlying the one or more sidewalls. The device also includes an optical member having a wavelength selective surface configured to block substantially direct emission of the at least one LED and configured to transmit at least one selected wavelength of reflected emission caused by an interaction with the wavelength conversion material.

According to another embodiment, the present invention provides an optical device. The device includes a substrate member having a surface region. The device also includes at least one LED configured overlying one or more portions of the surface region. The device further includes a wavelength conversion material disposed over the surface region. Additionally, the device includes an optical member having a wavelength selective surface configured to block substantially direct emission of the at least one LED and configured to transmit at least one selected wavelength of reflected emission caused by an interaction with the wavelength conversion material.

One or more benefits may be achieved using one or more of the specific embodiments. As an example, the present device and method provides for an improved lighting technique with improved efficiencies. In other embodiments, the present method and resulting structure are easier to implement using conventional technologies. In a specific embodiment, a blue LED device is capable of emitting electromagnetic radiation at a wavelength range from about 450 nanometers to about 495 nanometers and the yellow-green LED device is capable of emitting electromagnetic radiation at a wavelength range from about 495 nanometers to about 590 nanometers, although there can also be some variations.

DETAILED DESCRIPTION OF THE INVENTION

Figure 1:
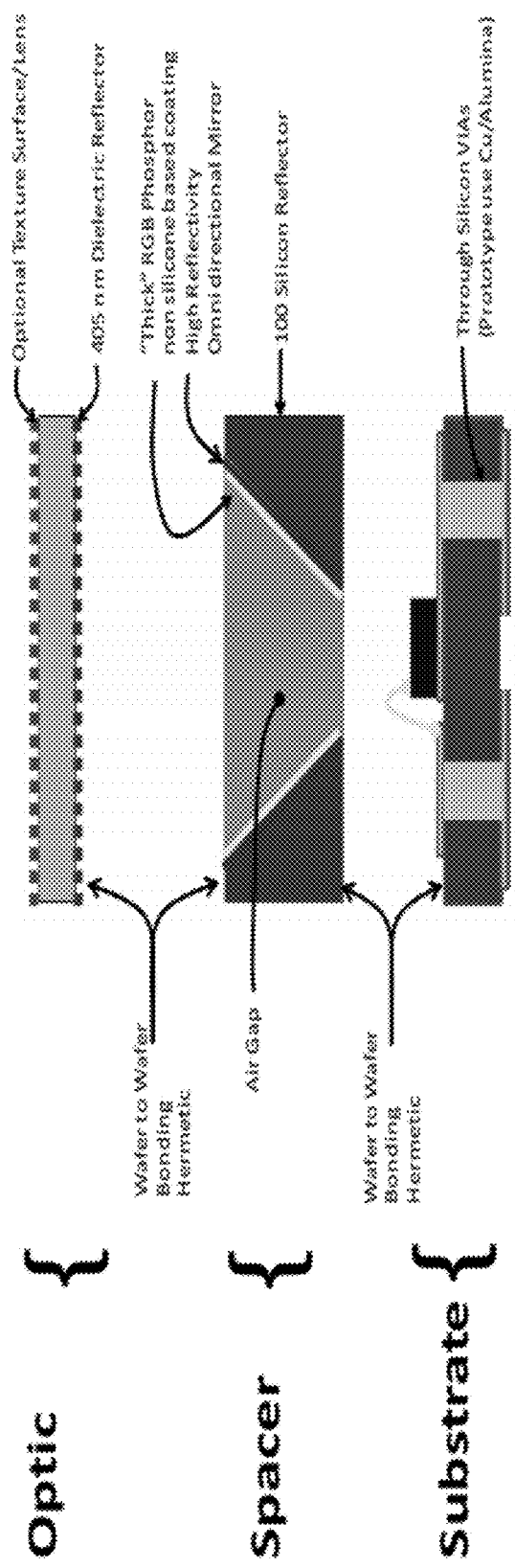
FIG. 1 is a simplified diagram illustrating an LED package according to an embodiment of the present invention.

As explained above, conventional LED based optical devices are often inadequate. One of the challenges has been that light emitted by LED devices not being efficiently emitted. More specifically, an LED device is positioned on a substrate and covered by an optic. FIG. 1 is a simplified diagram illustrating an LED package according to an embodiment of the present invention. As shown in FIG. 1, the LED package comprises an optic, a spacer, and a substrate. An LED device is positioned on the substrate. Among other things, the LED package is configured to achieve a high efficiency where the phosphor operates in reflection. In one embodiment, these components are fabricated at the wafer level and assembled before division into individual parts.

Figure 2:
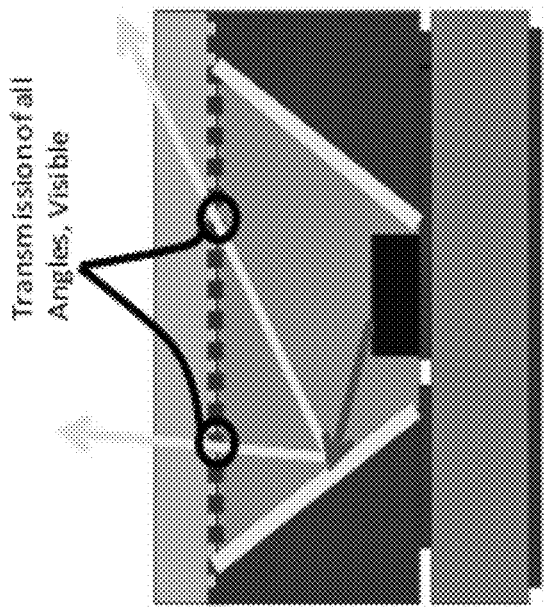
FIG. 2 is a simplified diagram illustrating light path in an LED package.
Figure 2:
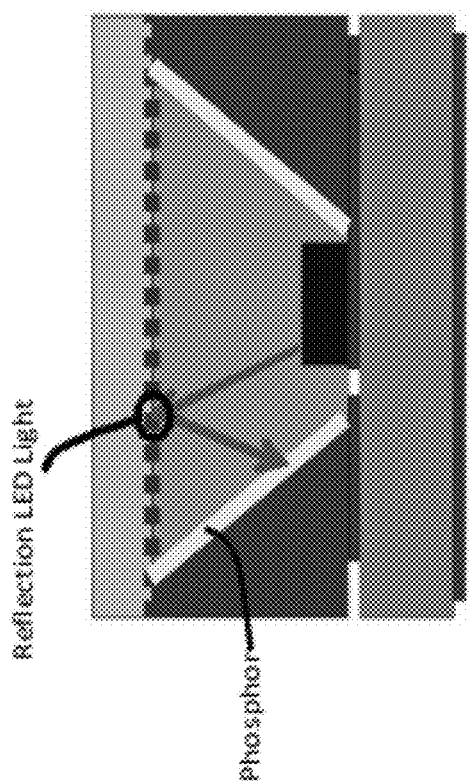

FIG. 2 is a simplified diagram illustrating light path in an LED package. As shown in FIG. 2, the bottom layer of the optic is coated with a dielectric filter. The dielectric is a long pass filter where it reflects the majority of LED light of all angles, but transmits the majority of the longer phosphor emission. For example, the dielectric reflector reflects light of 405 nm (e.g., blue or violet color) back to the phosphor material on spacer to cause the 405 nm light emitted by the LED device to be absorbed by the phosphor material. Depending on the types of phosphor and/or LED device are used, the dielectric reflector may be configured to reflect other wavelength(s) as well.

FIG. 2 is a simplified diagram illustrating a dielectric filter used in an LED package. As shown in FIG. 2, LED light of certain wavelength (e.g., around 405 nm) is reflected back by the optics on the phosphor material on the spacer. The phosphor material converts the reflected light into a different wavelength, and the converted light passes through the optic.

Figure 3:
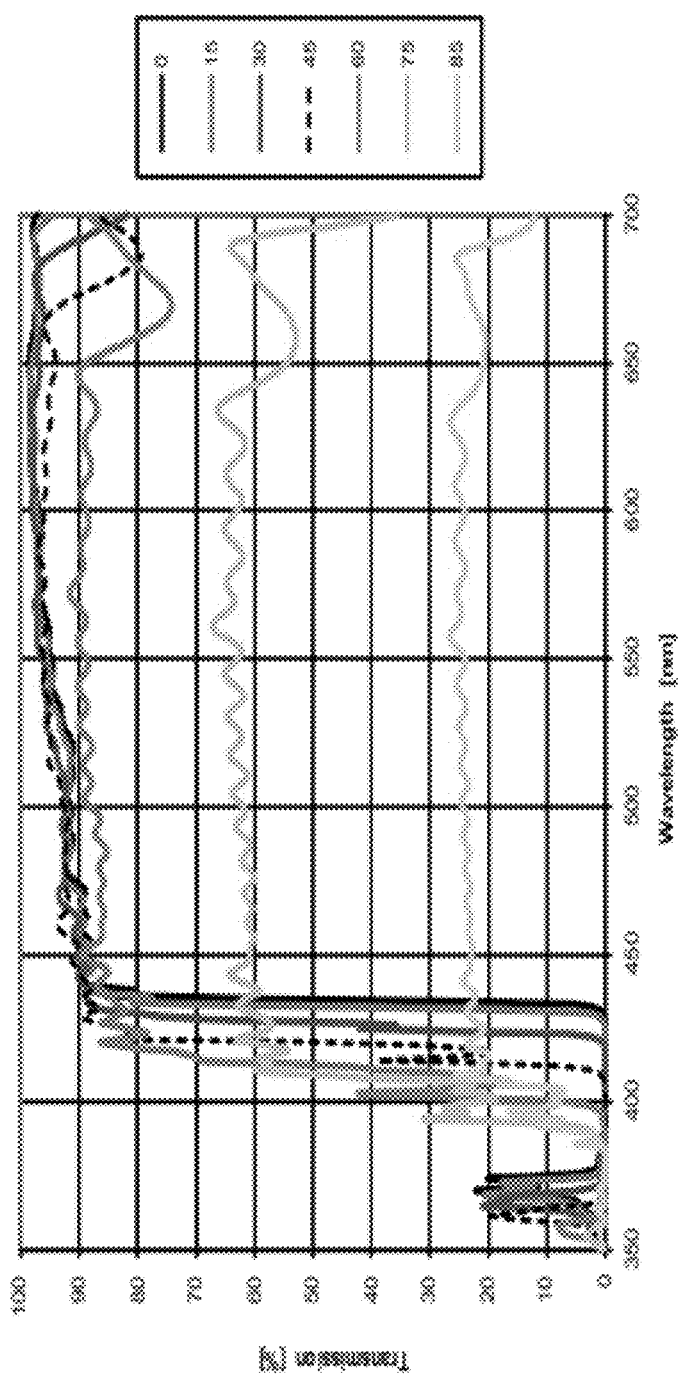
FIG. 3 is a simplified diagram illustrating the reflectivity function of a dielectric filter that reflects 405 nm LED light.

FIG. 3 is a simplified diagram illustrating the reflectivity function of a dielectric filter that reflects 405 nm LED light. In an embodiment, the top surface of the optic has a textured surface to diffuse the light.

Figure 4:
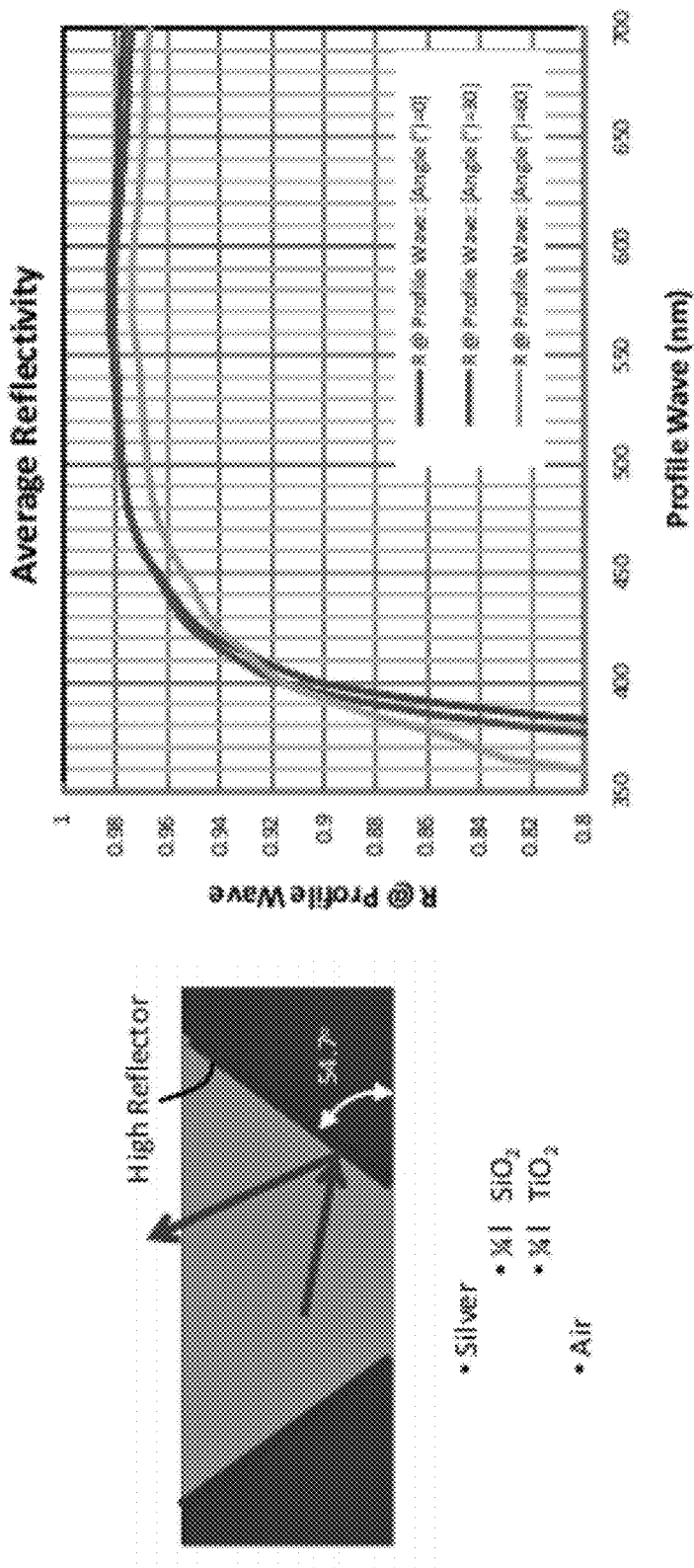
FIG. 4 illustrates the spacer with the cavity walls coated with the high reflector coating according to embodiments of the present invention.

Among other things, the spacer is configured to separate the optic from the substrate to leave a cavity for LED. In various embodiments, the spacer is approximate 250 um to 2000 um thick. In one embodiment, the cavity is formed by etching silicon along the 1-0-0 plane to resulting in walls with an angle of between 50~60 degrees. These walls are coated with a high reflectivity coating to form a high reflectivity cavity. In one embodiment, the coating is a layer of silver over coated with a ¼ wave or SiO2 and ¼ wave of TiO2. FIG. 4 illustrates the spacer with the cavity walls coated with the reflective coating.

Figure 5:
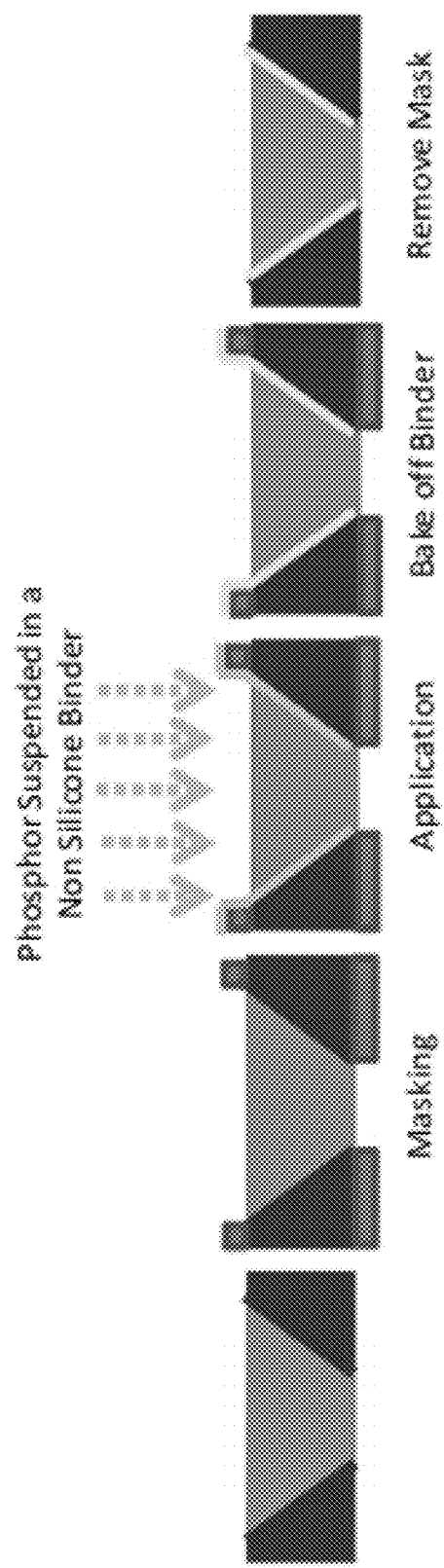
FIG. 5 is a simplified diagram illustrates a processing of coating phosphor material.
Figure 6:
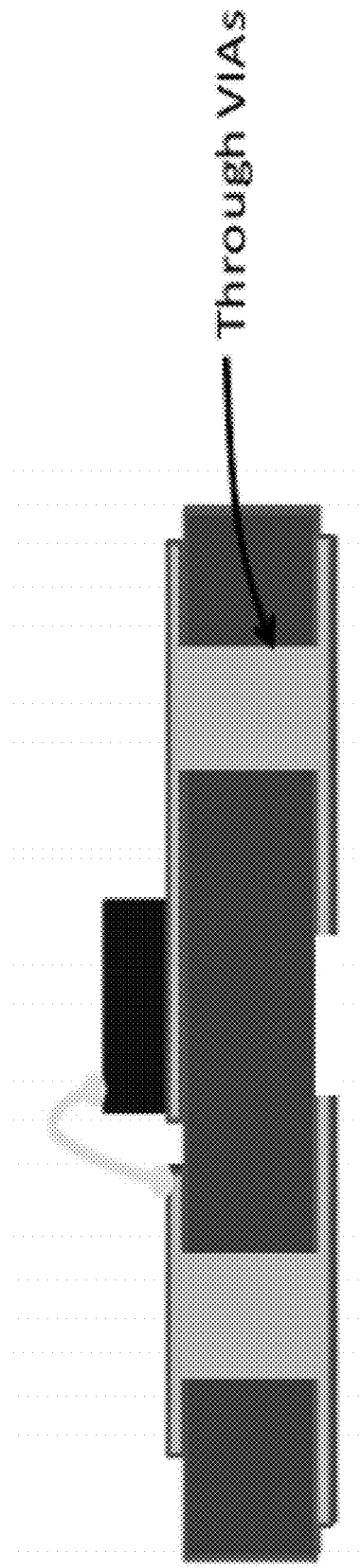
FIG. 6 is a simplified diagram illustrating an LED device coupled to conductive material through VIAS according to an embodiment of the present invention.

In certain embodiments, the reflective coating is further coated with a layer of phosphor. Preferably, the layer of phosphor is thick enough such that almost all the light is back scattered and little of it reaches the mirror surface. This results in only a small amount of light emitted from the LED reaching the mirror surface. FIG. 5 is a simplified diagram illustrates a processing of coating phosphor material. FIG. 6 is a simplified diagram illustrating an LED device coupled to conductive material through vias.

Coating the phosphor on the side walls has advantages, including: (i) the output of the aperture is not blocked by phosphor enabling higher package efficiencies; (ii) the phosphor can be coated on surfaces that can have a heat sink to cool the phosphor; and (iii) phosphor backscattering is used advantageously to increase reflection from the package surfaces.

The LED device is mounted on a thermally conductive but electrically insulating substrate. The substrate has electrically conductive patterns formed on the top and bottom surfaces. These top and bottom surfaces are connected by electrical vias. In one embodiment, the substrate is made of a ceramic material such as alumina or alumina nitride. For example, the vias are fabricated by laser drilling and plating. In another embodiment, the substrate is made of silicon. The surface of the silicon is made electrically insulating by a formation of a thermal oxide of SiO2 on top of which the electrically conductive patterns are formed. Through the silicon material, via are used to connect the top and bottom conductive patterns. In another embodiment, the vias are formed by etching holes alone the 1-0-0 plane such as that is similar to that commercially available to hymite.

As explained above, it is often desirable to reflect light emitted to phosphor material, which converts the reflected light from one wavelength to another. In various embodiments, the present invention provides optical geometries based on total internal reflection to achieve an LED package where the phosphor is positioned in reflection geometry.

Using the phosphor in refection mode has several advantages over traditional phosphor transmission geometries.

Figure 7:
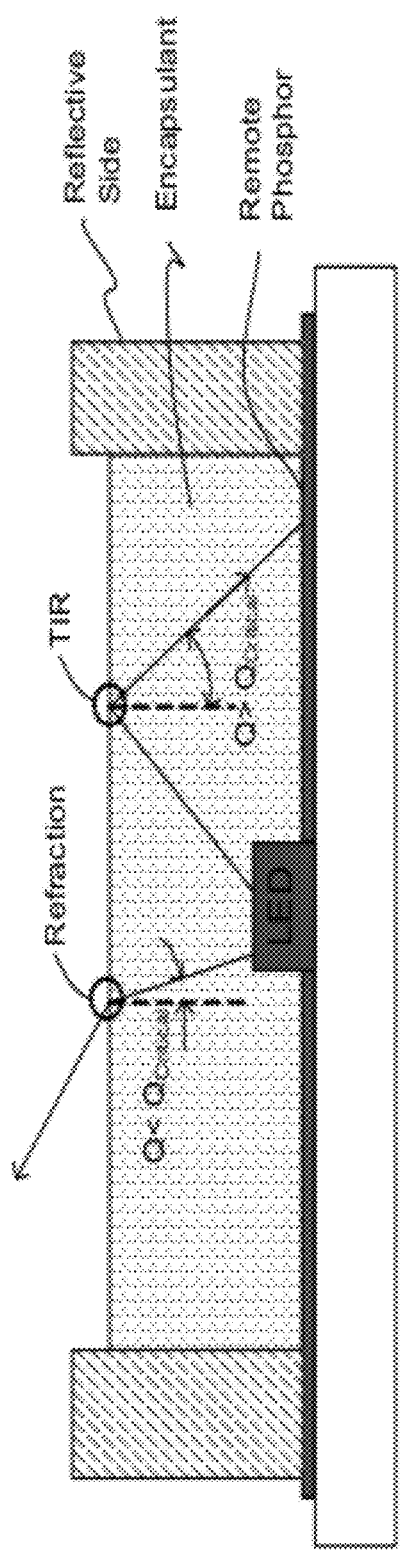
FIG. 7 illustrates an encapsulated LED, where the phosphor is coated on to the floor of an LED package.

FIG. 7 illustrates an encapsulated LED, where the phosphor is coated on to the floor of an LED package. The portion of the LED emission beyond the critical angle is 100% reflected back into the package to be absorbed by the phosphor. However, there is a portion of the light emission that is below the critical angle and is transmitted. One of the goals is to minimize the emission this LED leakage.

Figure 8:
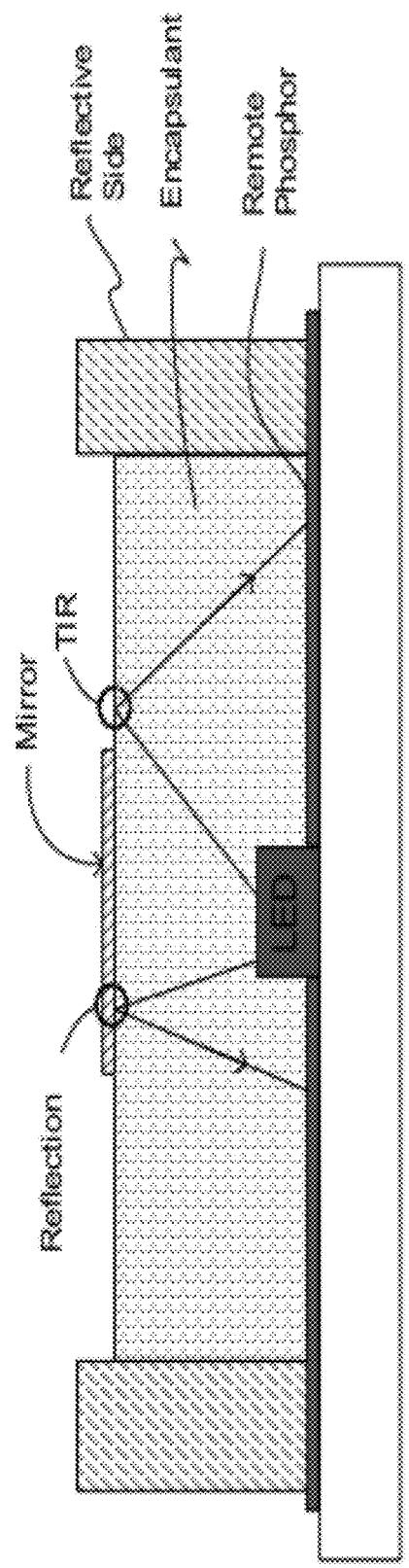
FIG. 8 illustrates a portion of the exit aperture below the critical angle that covered by a mirror according to an embodiment of the present invention.

FIG. 8 illustrates a portion of the exit aperture below the critical angle that covered by a mirror according to an embodiment of the present invention. As shown in FIG. 8, the leakage light is now reflected back on the phosphor.

Figure 9:
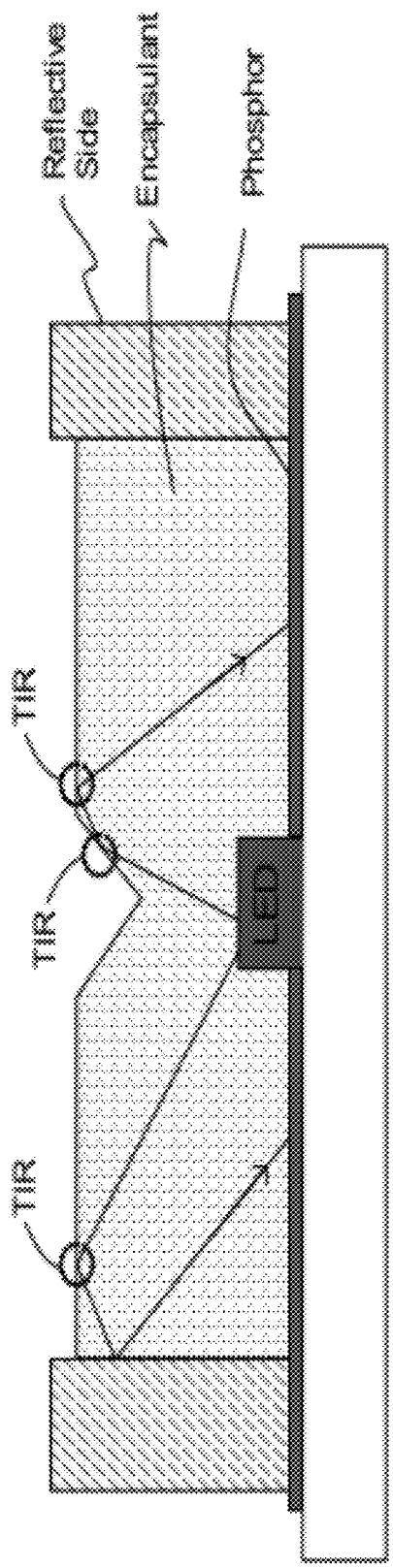
FIG. 9 is a simplified diagram illustrating an LED package having a shaped aperture according to embodiments of the present invention.

FIG. 9 is a simplified diagram illustrating an LED package having a shaped aperture according to embodiments of the present invention. As shown, a portion of the exit aperture is shaped to ensure that all rays emitted directly from the LED will be totally internally reflected back onto the phosphor.

Figure 10:
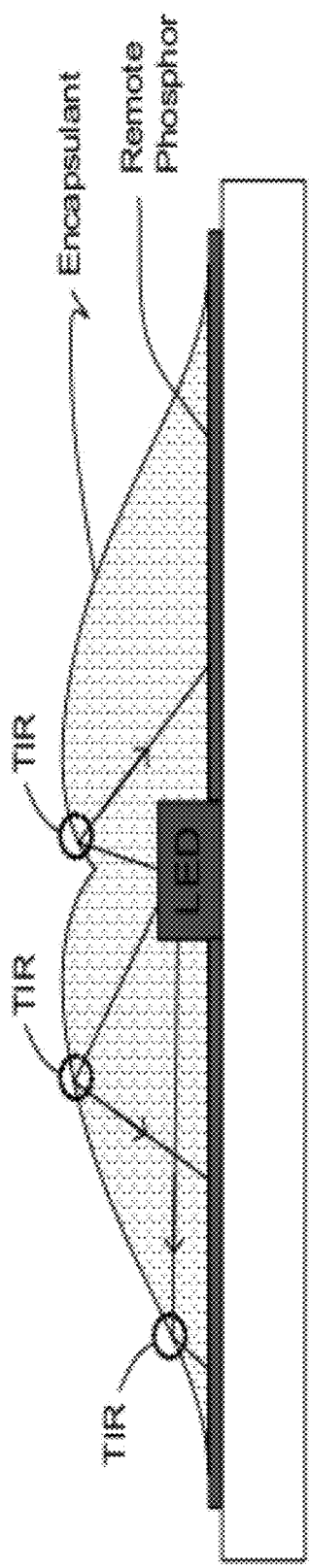
FIG. 10 is a simplified diagram illustrating an LED package having a shaped exit aperture according to embodiments of the present invention.

FIG. 10 is a simplified diagram illustrating an LED package having a shaped exit aperture according to embodiments of the present invention. As shown, the exit aperture has a curved shape, which substantially eliminates the need of the reflective sides.

Figure 11:
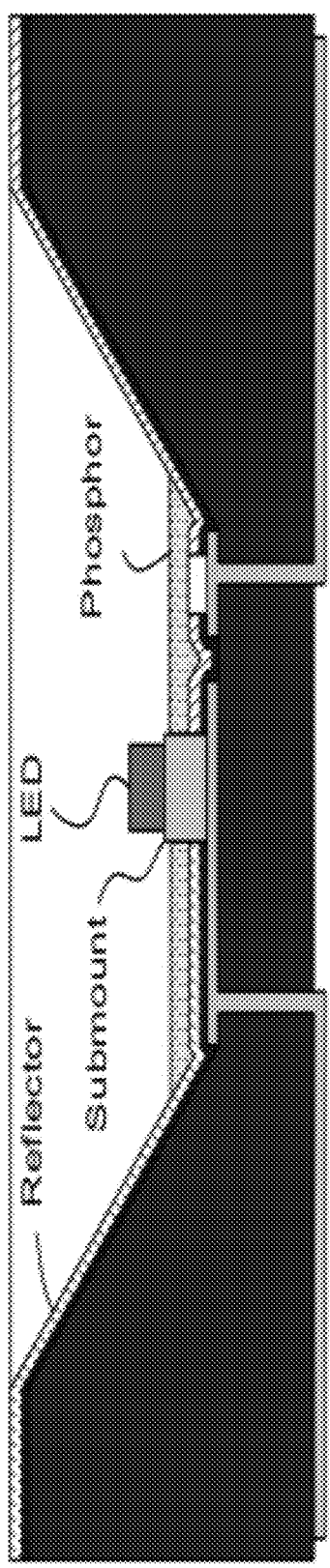
FIG. 11 is a simplified diagram illustrating an LED package according to an embodiment of the present invention.

In various embodiments, the reflectors are provided on the sides of the substrate. FIG. 11 is a simplified diagram illustrating an LED package according to an embodiment of the present invention. For example, in reflection mode, LED package comprises phosphor material residing on the same surface as the LED. For example, the phosphor layer can be tens to hundreds of micron thick. This thickness can block the light emitting surfaces of the LED. The LED package as shown in FIG. 11 includes a submont on the substrate that raises the LED device above the surface of the phosphor.

Figure 12:
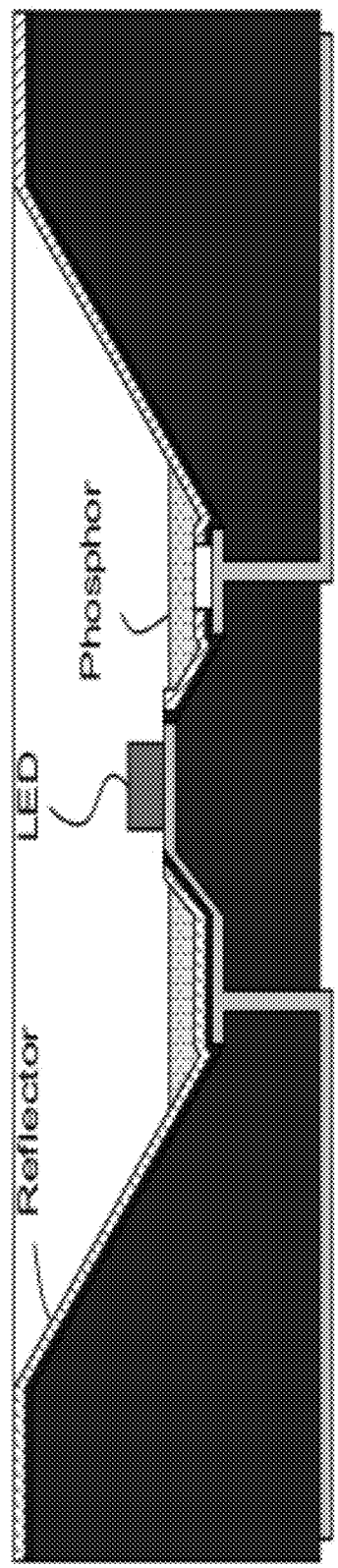
FIG. 12 is a simplified diagram illustrating an LED package having recess regions for phosphor material according to an embodiment of the present invention.

FIG. 12 is a simplified diagram illustrating an LED package having recess regions for phosphor material according to an embodiment of the present invention. As shown, a portion of floor of the LED package is raised where the LED is mounted. For example, for package made of silicon, the raised platform is formed during the etching process.

It is to be appreciated that there are other embodiments as well. For example, LED packages having wavelength conversion material is described in U.S. patent application Ser. No. 12/887,207, filed Sep. 21, 2010, which is incorporated by reference herein for all purposes.

As described above, phosphor material is used as wavelength conversion material. But it is to be understood that other types of material can be used as well. Wavelength conversion materials can be ceramic or semiconductor particle phosphors, ceramic or semiconductor plate phosphors, organic or inorganic downconverters, upconverters (anti-stokes), nanoparticles and other materials which provide wavelength conversion. Some examples are listed below:

$(Sr,Ca)10(PO_4)6*B_2O_3:Eu^{2+}$ (wherein $0<n^1$)
$(Ba,Sr,Ca)5(PO_4)3(Cl,F,Br,OH):Eu^{2+},Mn^{2+}$
$(Ba,Sr,Ca)BPO_5:Eu^{2+},Mn^{2+}$
$Sr_2Si_3O_8*2SrCl_2:Eu^{2+}$
$(Ca,Sr,Ba)3MgSi_2O_8:Eu^{2+}, Mn^{2+}$
$BaAl_8O_{13}:Eu^{2+}$
$2SrO*0.84P_2O_5*0.16B_2O_3:Eu^{2+}$
$(Ba,Sr,Ca)MgAl_{10}O_{17}:Eu^{2+},Mn^{2+}$
$K_2SiF_6:Mn^{4+}$
$(Ba,Sr,Ca)Al_2O_4:Eu^{2+}$
$(Y,Gd,Lu,Sc,La)BO_3:Ce^{3+},Tb^{3+}$
$(Ba,Sr,Ca)2(Mg,Zn)Si_2O_7:Eu^{2+}$
$(Mg,Ca,Sr, Ba,Zn)2Si1\_xO4\_2x:Eu^{2+}$(wherein $0<x=0.2$)
$(Sr,Ca,Ba)(Al,Ga,m)2S_4:Eu^{2+}$
$(Lu,Sc,Y,Tb)2\_u\_vCe_vCa_{1+u}Li_wMg_{2\_w}Pw(Si,Ge)3\_wO12\_u/2$ where $-O.SSu^1; 0<v£Q.1;$ and $OSw^O.2$
$(Ca,Sr)8(Mg,Zn)(SiO_4)4Cl_2:Eu^{2+},Mn^{2+}$
$Na_2Gd_2B_2O_7:Ce^{3+},Tb^{3+}$
$(Sr,Ca,Ba,Mg,Zn)2P_2O_7:Eu^{2+},Mn^{2+}$
$(Gd,Y,Lu,La)2O_3:Eu^{3+},Bi^{3+}$
$(Gd,Y,Lu,La)2O_2S:Eu^{3+},Bi^{3+}$
$(Gd,Y,Lu,La)VO_4:Eu^{3+},Bi^{3+}$
$(Ca,Sr)S:Eu^{2+},Ce^{3+}$
$(Y,Gd,Tb,La,Sm,Pr,Lu)3(Sc,Al,Ga)5\_nO12\_3/2n:Ce^{3+}$ (wherein $0^0^0.5$)
$ZnS:Cu+,Cl\sim$
$ZnS:Cu+,Al^{3+}$
$ZnS:Ag+,Al^{3+}$
$SrY_2S_4:Eu^{2+}$
$CaLa_2S_4:Ce^{3+}$
$(Ba,Sr,Ca)MgP_2O_7:Eu^{2+},Mn^{2+}$
$(Y,Lu)2WO_6:Eu^{3+},Mo^{6+}$
$CaWO_4$
$(Y,Gd,La)2O_2S:Eu^{3+}$
$(Y,Gd,La)2O_3:Eu^{3+}$
$(Ca,Mg)xSyO:Ce$
$(Ba,Sr,Ca)nSi_nN_n:Eu^{2+}$ (wherein $2n+4=3n$)
$Ca_3(SiO_4)Cl_2:Eu^{2+}$
$ZnS:Ag+,Cl\sim$
$(Y,Lu,Gd)2\_nCaSi_4N_{6+n}Cl\_n:Ce^{3+},$ (wherein $OSn^O.5$)
$(Lu,Ca,Li,Mg,Y)alpha-SiAlON$ doped with $Eu^{2+}$ and/or $Ce^{3+}$
$(Ca,Sr,Ba)SiO_2N_2:Eu^{2+},Ce^{3+}$
$(Sr,Ca)AlSiN_3:Eu^{2+}$
$CaAlSi(ON)3:Eu^{2+}$
$Sr_{10}(PO_4)6Cl_2:Eu^{2+}$
$(BaSi)O_{12}N_2:Eu^{2+}$
$SrSi_2(O,Cl)2N_2:Eu^{2+}$
$(Ba,Sr)Si_2(O,Cl)2N_2:Eu^{2+}$
$LiM_2O_8:Eu^{3+}$ where $M=(W$ or $Mo)$ For purposes of the application, it is understood that when a phosphor has two or more dopant ions (i.e. those ions following the colon in the above phosphors), this is to mean that the phosphor has at least one (but not necessarily all) of those dopant ions within the material. That is, as understood by those skilled in the art, this type of notation means that the phosphor can include any or all of those specified ions as dopants in the formulation.

The above has been generally described in terms of one or more entities that may be one or more phosphor materials or phosphor like materials, but it would be recognized that other "energy-converting luminescent materials," which may include one or more phosphors, semiconductors, semiconductor nanoparticles ("quantum dots"), organic luminescent materials, and the like, and combinations of them, can also be used. In one or more preferred embodiments, the energy converting luminescent materials can generally be one or more wavelength converting material and/or materials or thicknesses of them. Furthermore, the above has been generally described in electromagnetic radiation that directly emits and interacts with the wavelength conversion materials, but it would be recognized that the electromagnetic radiation can be reflected and then interacts with the wavelength conversion materials or a combination of reflection and direct incident radiation. In other embodiments, the present specification describes one or more specific gallium and nitrogen containing surface orientations, but it would be recognized that any one of a plurality of family of plane orientations can be used. Therefore, the above description and illustrations should not be taken as limiting the scope of the present invention which is defined by the appended claims.

What is claimed is:

1. An optical device comprising:
   a substrate having an upper surface;
   a light emitting diode (LED) which emits light at first selected wavelengths, the LED being mounted on the upper surface;
   a spacer having reflective sidewalls also mounted on the upper surface to surround the LED;
   a wavelength selective reflector disposed above the upper surface and the LED for preventing substantially all light at the first selected wavelengths from escaping from the optical device and allowing substantially all light at second selected wavelengths to pass through it and escape from the optical device; and
   wavelength conversion material disposed between the upper surface and the wavelength selective reflector, whereby the wavelength conversion material in response to light at the first selected wavelengths emits light at second selective wavelengths.

2. The device of claim 1 wherein the wavelength selective surface comprises dielectric material.

3. The device of claim 1 wherein the substrate comprises silicon.

4. The device of claim 1 wherein the wavelength conversion material comprises phosphor material.

5. An optical device as in claim 1 wherein the wavelength conversion material is disposed on the upper surface.

6. An optical device as in claim 5 wherein the substrate comprises thermally conductive material.

7. An optical device as in claim 1 wherein the wavelength conversion material is disposed on the reflective sidewalls of the spacer.

8. An optical device as in claim 7 wherein the sidewalls of the spacer are angled with respect to the upper surface such that the reflective sidewalls reflect light toward the wavelength selective reflector.

9. An optical device as in claim 1 wherein the LED emits light that is not white light.

10. An optical device as in claim 9 wherein the LED emits light of about 405 nm wavelength.

11. An optical device as in claim 9 wherein the second selected wavelengths are white light.

12. An optical device as in claim 11 wherein the wavelength selective reflector has a textured surface to diffuse white light.

13. An optical device as in claim 1 further comprising an encapsulant disposed within the spacer and above the upper surface to encapsulate the LED.

14. An optical device as in claim 13 wherein the wavelength selective reflector comprises a mirror disposed only on a portion of the encapsulant above the LED to reflect light from the LED back toward the upper surface.

15. An optical device as in claim 14 wherein the portion is only a central portion of the encapsulant and wavelength conversion material is disposed on the upper surface.

16. An optical device as in claim 15 wherein light at first selected wavelengths is reflected by total internal reflection from the encapsulant not covered by the mirror.

17. An optical device as in claim 13 wherein the encapsulant has an upper surface which is configured to cause total internal reflection of the first selected wavelengths within the encapsulant.

18. An optical device comprising:
    a substrate having an upper surface;
    a light emitting diode (LED) device which emits light at first selected wavelengths, mounted on the upper surface;
    a wavelength selective reflector disposed above the upper surface and the LED for preventing substantially all light at the first selected wavelengths from escaping from the optical device;
    a layer of wavelength conversion material disposed on the upper surface around the LED, an upper surface of the wavelength conversion material being below an upper surface of the LED, whereby the wavelength conversion material in response to light at the first selected wavelengths emits light at second selective wavelengths, and wherein the wavelength selective reflector allows substantially all light at the second selected wavelengths to escape from the optical device; and
    a reflective sidewall surrounding the LED.

19. The device of claim 18 wherein the wavelength conversion material comprises phosphor material.

* * * * *